(12) United States Patent
Hwang et al.

(10) Patent No.: US 8,809,884 B2
(45) Date of Patent: Aug. 19, 2014

(54) LIGHT EMITTING DEVICE INCLUDING AN ELECTRODE ON A TEXTURED SURFACE, LIGHT EMITTING DEVICE PACKAGE AND LIGHTING SYSTEM

(75) Inventors: Sung Min Hwang, Seoul (KR); Hyun Don Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/909,184

(22) Filed: Oct. 21, 2010

(65) Prior Publication Data
US 2011/0095306 A1 Apr. 28, 2011

(30) Foreign Application Priority Data
Oct. 22, 2009 (KR) ........................ 10-2009-0100812

(51) Int. Cl.
*H01L 33/00* (2010.01)

(52) U.S. Cl.
USPC ............................................ 257/98; 438/29

(58) Field of Classification Search
None
See application file for complete search history.

(56) References Cited

U.S. PATENT DOCUMENTS

| | | | | |
|---|---|---|---|---|
| 5,779,924 A * | 7/1998 | Krames et al. | | 216/24 |
| 6,900,473 B2 * | 5/2005 | Yoshitake et al. | | 257/95 |
| 7,037,738 B2 * | 5/2006 | Sugiyama et al. | | 438/29 |
| 7,834,369 B2 * | 11/2010 | Yao et al. | | 257/95 |
| 8,034,647 B2 * | 10/2011 | Batres et al. | | 438/29 |
| 2006/0091409 A1 * | 5/2006 | Epler et al. | | 257/95 |
| 2007/0194325 A1 | 8/2007 | Sung et al. | | |
| 2009/0230407 A1 | 9/2009 | Fan et al. | | 257/79 |
| 2010/0264440 A1 | 10/2010 | Park | | 257/98 |

FOREIGN PATENT DOCUMENTS

| | | |
|---|---|---|
| CN | 101159307 A | 4/2008 |
| CN | 101257075 A | 9/2008 |
| JP | 2007-227895 A | 9/2007 |
| JP | 2008-282966 A | 11/2008 |
| KR | WO 2005/088741 | 9/2005 |
| KR | 10-2007-0087502 A | 8/2007 |
| KR | 10-2008-0061697 | 7/2008 |
| KR | 10-2009-0018451 | 2/2009 |
| KR | 10-2009-0054008 A1 | 5/2009 |

OTHER PUBLICATIONS

Korean Notice of Allowance dated Dec. 27, 2011 issued in Application No. 10-2009-0100812.
Chinese Office Action dated Mar. 5, 2014, issued in Application No. 201010522369.0 (with English translation).

* cited by examiner

*Primary Examiner* — Andres Munoz
(74) *Attorney, Agent, or Firm* — KED & Associates LLP (57) ABSTRACT

Disclosed are a light emitting device, a light emitting device package and a lighting system. The light emitting device of the embodiment includes a light emitting structure including a first conductive semiconductor layer, a second conductive semiconductor layer and an active layer between the first and second conductive semiconductor layers; a second electrode under the second conductive semiconductor layer; a first texture over a first region of the first conductive semiconductor layer; an A-electrode over the first region of the first conductive semiconductor layer; and a B-electrode over a second region of the first conductive semiconductor layer, wherein the B-electrode includes a pad electrode connected to a wire.

23 Claims, 11 Drawing Sheets

LIGHT EMITTING DEVICE INCLUDING AN ELECTRODE ON A TEXTURED SURFACE, LIGHT EMITTING DEVICE PACKAGE AND LIGHTING SYSTEM

CROSS-REFERENCE TO RELATED APPLICATION

This application claims under 35 U.S.C. §119 to Korean Patent Application No. 10-2009-0100812, filed Oct. 22, 2009.

FIELD

One or more embodiments described herein relate to a light emitting device, a light emitting device package, and/or a lighting system.

BACKROUND

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated. This energy is realized as heat or light, and the LED emits the energy in the form of light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

According to the related art, a part of light generated from the active layer is absorbed or reflected by an electrode, thereby causing loss in the light emitting device. Thus, the light emitting efficiency is lowered.

In addition, according to the related art, current crowding may occur in the light emitting device so that the life span of the light emitting device is shortened and the reliability of the light emitting device is degraded.

BRIEF SUMMARY

One embodiment provides a light emitting device capable of improving the light extraction efficiency as well as the current spreading effect, and a method of manufacturing the same.

A light emitting device according to one embodiment may include a light emitting structure including a first conductive semiconductor layer, a second conductive semiconductor layer and an active layer between the first and second conductive semiconductor layers; a second electrode under the second conductive semiconductor layer; a first texture over a first region of the first conductive semiconductor layer; an A-electrode over the first region of the first conductive semiconductor layer; and a B-electrode over a second region of the first conductive semiconductor layer, wherein the B-electrode includes a pad electrode connected to a wire.

A light emitting device package according to one embodiment may include a package body; third and fourth electrode layers over the package body; and a light emitting device electrically connected to the third and fourth electrodes.

A lighting system according to one embodiment may include a substrate; and a light emitting module including a light emitting device package over the substrate, wherein the light emitting device package may include a package body; third and fourth electrode layers over the package body; and a light emitting device electrically connected to the third and fourth electrodes.

DETAILED DESCRIPTION OF THE EMBODIMENTS

Hereinafter, a light emitting device, a light emitting device package, and a lighting system according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiments)

Figure 1:
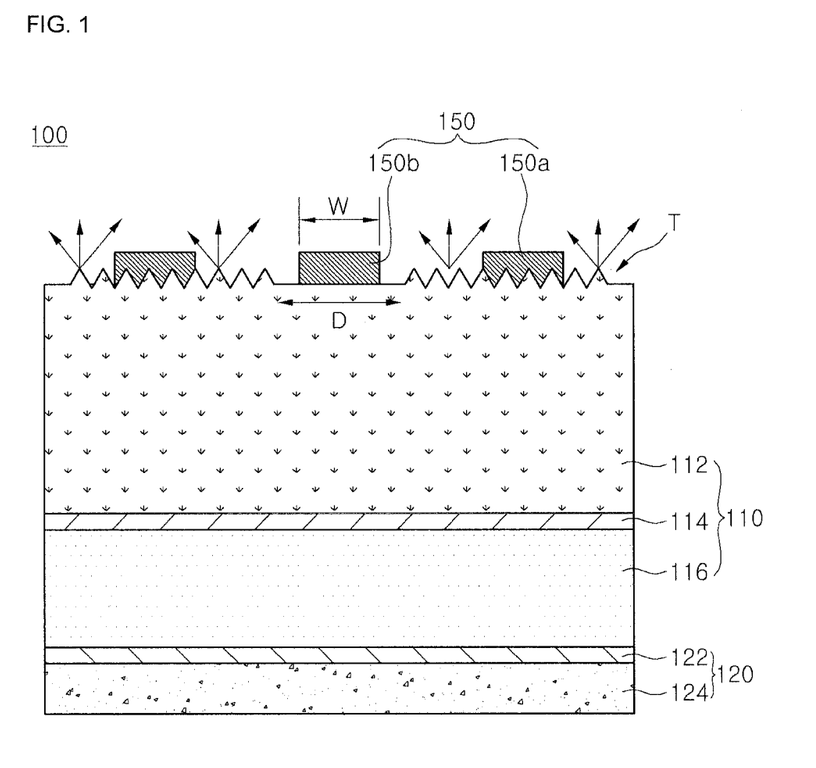
FIG. 1 is a sectional view showing a light emitting device according to the embodiment.
Figure 2:
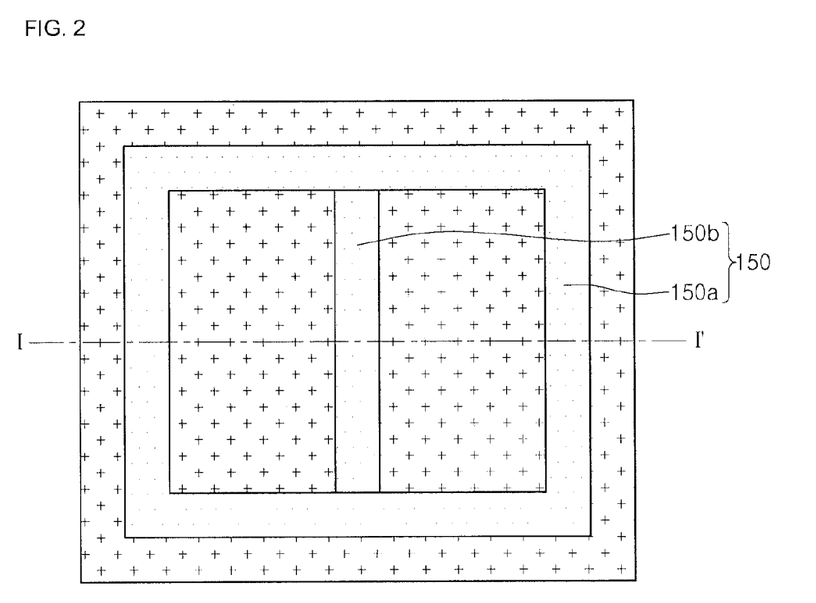
FIG. 2 is a plan view showing a light emitting device according to the embodiment.

FIG. 1 is a sectional view of a light emitting device according to the embodiment taken along line I-I' of FIG. 2, and FIG. 2 is a plan view showing the light emitting device according to the embodiment.

The light emitting device 100 according to the embodiment includes a light emitting structure 110 including a first conductive semiconductor layer 112, an active layer 114, and a second conductive semiconductor layer 116; a second electrode 120 under the second conductive semiconductor layer 116; a first texture T over a first region of the first conductive semiconductor layer 112; an A-electrode 150a over the first region of the first conductive semiconductor layer 112; and a B-electrode 150b over a second region of the first conductive semiconductor layer 112. The A-electrode 150a and the B-electrode 250 may constitute a first electrode 150. As shown in FIG. 1, a top surface of the A-electrode 150a is at substantially a same level as a top surface of the B-electrode 150b.

The light emitting device according to the embodiment can improve the current spreading effect by adjusting the contact resistance based on the existence of the texture at the contact area between the first conductive semiconductor layer and the first electrode of the light emitting device and can enhance the light extraction efficiency by minimizing light absorption in the pad electrode.

Figure 3:
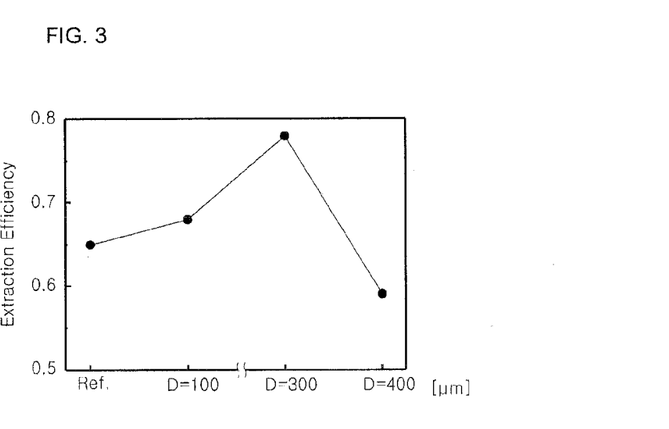
FIG. 3 is a graph showing the light extraction efficiency of a light emitting device according to the embodiment.
Figure 4:
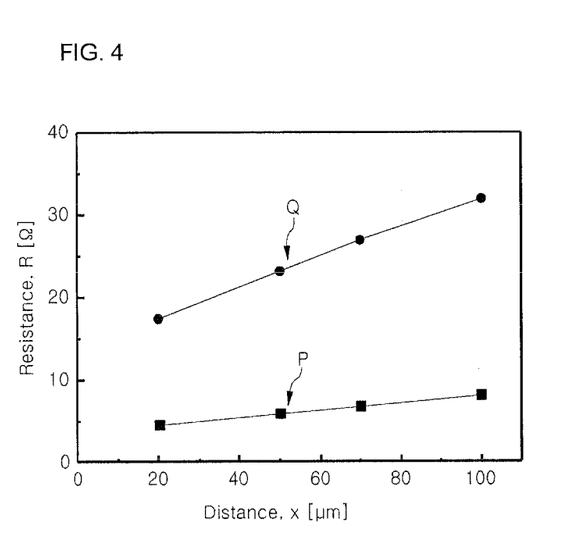
FIG. 4 is a graph showing the resistance of a light emitting device according to the embodiment.

FIG. 3 is a graph showing the light extraction efficiency of the light emitting device according to the embodiment and FIG. 4 is a graph showing the resistance of the light emitting device according to the embodiment.

FIG. 3 shows the light extraction efficiency according to the width D of a region having no texture under the B-electrode 150*b* serving as the pad electrode of the first conductive semiconductor layer 112 shown in FIG. 1.

According to the related art, the quantity of light absorbed in the first electrode is increased due to the light scattering caused by the texture formed under the first electrode, so that the light extraction efficiency is lowered. In addition, since the surface area is enlarged due to the texture formed under the first electrode, the quantity of light absorbed in the first electrode is increased, so that the light extraction efficiency is lowered.

According to the embodiment, the B-electrode 150*b* serving as the pad electrode and having a predetermined length is formed on a predetermined region of the first conductive semiconductor layer 112 where the texture T is not formed, so that the quantity of the light absorbed in the pad electrode is reduced, thereby improving the light extraction efficiency. For instance, according to the embodiment, the texture T is not formed on the predetermined region of the first conductive semiconductor layer 112, in which the predetermined region has an area corresponding to an area of the B-electrode 150*b* serving as the pad electrode connected to the wire, so that the light extraction efficiency can be improved, but the embodiment is not limited thereto. For example, the width D of the second region having no texture T is set to 300 μm corresponding to the width W of the B-electrode 150*b* serving as the pad electrode, so that the light extraction efficiency can be remarkably improved, but the embodiment is not limited thereto.

In addition, the width D of the second region having no texture T is in the range of ±5% based on the width of the B-electrode 150*b* serving as the pad electrode of the first conductive semiconductor layer 112.

FIG. 4 shows the resistance according to the distance between electrodes when the texture is formed under the electrode (indicated by P) and when the texture is not formed under the electrode (indicated by Q) in the first conductive semiconductor layer 112. In FIG. 4, the X-axis represents the distance x between the first electrodes 150.

According to the embodiment, since the texture is not formed under the B-electrode 150*b* serving as the pad electrode, the contact resistance between the light emitting structure and the B-electrode 150*b* serving as the pad electrode becomes high, so that the current crowding can be prevented from occurring under the pad electrode. In addition, since the texture is formed on the remaining region of the light emitting structure, the contact resistance between the light emitting structure and the A-electrode 150*a* becomes low, so that the current spreading effect can be improved.

According to the light emitting device and the method of manufacturing the same of the embodiment, the current spreading effect can be improved by adjusting the contact resistance based on the existence of the texture at the contact area between the first conductive semiconductor layer and the first electrode of the light emitting device and the light extraction efficiency can be enhanced by minimizing light absorption in the pad electrode.

For instance, according to the embodiment, since the texture is not formed at the contact area between the first conductive semiconductor layer and the pad electrode of the light emitting device, the light scattering caused by the texture can be reduced, so that the light absorption in the first electrode can be reduced. In addition, since the contact resistance of the contact area is higher than that of other areas, the current crowding can be prevented from occurring under the pad electrode.

In addition, according to the light emitting device of the embodiment, the texture is formed at the contact area between the first conductive semiconductor layer and the A-electrode, other than the B-electrode serving as the pad electrode, so that the contact resistance is reduced, thereby improving the current spreading effect.

Although the embodiment discloses the first texture T formed under the A-electrode 150*a*, the embodiment is not limited thereto. That is, according to the embodiment, the texture T can be partially formed under the B-electrode 150*b* as well as under the A-electrode 150*a*. For instance, the similar effect can be obtained if the concentration of the second texture under the B-electrode 150*b* is lower than the concentration of the first texture under the A-electrode 150*a*.

Hereinafter, the method of manufacturing the light emitting device according to the embodiment will be described with reference to FIGS. 5 to 9.

Figure 5:
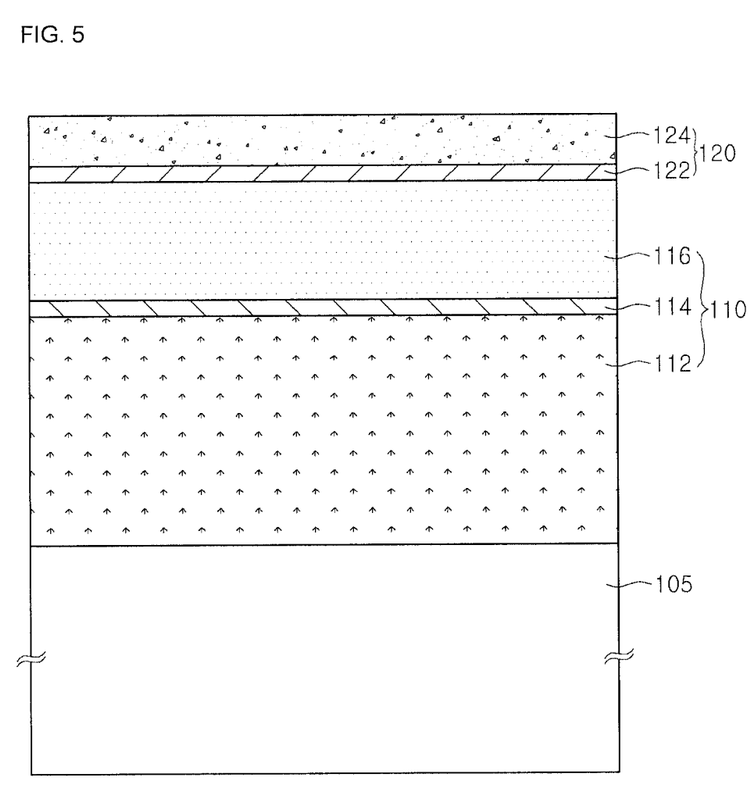
FIGS. 5 to 9 are sectional views showing the method for manufacturing a light emitting device according to the embodiment.

First, the first substrate 105 is prepared as shown in FIG. 5. The first substrate 105 includes a conductive substrate or an insulating substrate. For instance, the first substrate 105 may include at least one of $Al_2O_3$, SiC, Si, GaAs, GaN, ZnO, Si, GaP, InP, Ge, and $Ga_2O_3$. A concave-convex structure can be formed on the first substrate 105, but the embodiment is not limited thereto.

The first substrate 105 can be subject to the wet cleaning to remove impurities formed on the surface of the first substrate 105.

Then, the light emitting structure 110 including the first conductive semiconductor layer 112, the active layer 114 and the second semiconductor layer 116 is formed on the first substrate 105.

For instance, the light emitting structure 110 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

A buffer layer (not shown) can be formed on the first substrate 105. The buffer layer may attenuate lattice mismatch between the light emitting structure 110 and the first substrate 105. The buffer layer may include a group III-V compound semiconductor. For instance, the buffer layer may include at least one of GaN, InN, AlN, InGaN, AlGaN, InAlGaN, and AlInN. An undoped semiconductor layer can be formed on the buffer layer, but the embodiment is not limited thereto.

The first conductive semiconductor layer 112 may include a group III-V compound semiconductor doped with a first conductive dopant. If the first conductive semiconductor layer 112 is an N type semiconductor layer, the first conductive dopant is an N type dopant, such as Si, Ge, Sn, Se, or Te, but the embodiment is not limited thereto.

The first conductive semiconductor layer 112 may include semiconductor material having the compositional formula of $In_xAl_yGa_{1-x-y}N$ ($0 \le x \le 1$, $0 \le y \le 1$, $0 \le x+y \le 1$).

In addition, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer, which is formed through the CVD, MBE, sputtering or HVPE. In addition, the first conductive semiconductor layer 112 can be formed by injecting trimethyl gallium (TMGa) gas, ammonia ($NH_3$) gas, nitrogen ($N_2$) gas and silane ($SiH_4$) gas including n type impurities, such as silicon, into the chamber.

The active layer 114 emits the light having energy determined based on the intrinsic energy band of the active layer (light emitting layer) 114 through the recombination of electrons injected through the first conductive semiconductor layer 112 and holes injected through the second conductive semiconductor layer 116.

The active layer 114 may include at least one of a single quantum well structure, a multiple quantum well (MQW) structure, a quantum wire structure or a quantum dot structure. For instance, the active layer 114 can be formed with the MQW structure by injecting TMGa gas, $NH_3$ gas, $N_2$ gas, and trimethyl indium (TMIn) gas, but the embodiment is not limited thereto.

The active layer 114 may have a pair structure of well/barrier layers including at least one of InGaN/GaN, InGaN/InGaN, GaN/AlGaN, InAlGaN/GaN, GaAs(InGaAs)/AlGaAs and GaP(InGaP)/AlGaP, but the embodiment is not limited thereto. The well layer may include material having the band gap energy lower than that of the barrier layer.

A conductive clad layer (not shown) can be formed on and/or under the active layer 114. The conductive clad layer may include an AlGaN-based semiconductor having the band gap energy higher than that of the active layer 114.

The second conductive semiconductor layer 116 includes the group III-V compound semiconductor doped with the second conductive dopant. For instance, the second conductive semiconductor layer 116 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 116 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba. The second conductive semiconductor layer 116 can be prepared as a single layer or a multiple layer, but the embodiment is not limited thereto.

The second conductive semiconductor layer 116 may include a p type GaN layer, which can be formed by injecting TMGa gas, $NH_3$ gas, $N_2$ gas and ($EtCp_2Mg$) {Mg ($C_2H_5C_5H_4$)$_2$} gas including p type impurities (for example, Mg) into the chamber, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, if the second conductive semiconductor layer 116 is P type semiconductor layer, a semiconductor layer, such as an N type semiconductor layer (not shown) having polarity opposite to that of the second conductive semiconductor layer 116, can be formed on the second conductive semiconductor layer 116. Thus, the light emitting structure 110 may include one of an N—P junction structure, a P—N junction structure, an N—P—N junction structure, and a P—N—P junction structure.

After that, the second electrode layer 120 is formed on the second conductive semiconductor layer 116.

The second electrode layer 120 may include an ohmic layer 122, a reflective layer 124, a bonding layer (not shown) and a conductive support substrate (not shown).

For instance, the ohmic layer 122 of the second electrode layer 120 comes into ohmic contact with the light emitting structure 110 to easily supply power to the light emitting structure 110. The ohmic layer 122 can be prepared as a multiple layer by stacking a single metal, a metal alloy, and metal oxide.

For instance, the ohmic layer 122 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the second electrode layer 120 may include the reflective layer 124 to reflect the light incident from the light emitting structure 110, thereby improving the light extraction efficiency.

For instance, the reflective layer 124 may include metal or a metal alloy including at least one selected from the group consisting of Ag, Ni, Al, Rh, Pd, Ir, Ru, Mg, Zn, Pt, Au, and Hf. In addition, the reflective layer 124 can be prepared as a multiple layer by using the above metal or metal alloy and transmissive conductive material, such as IZO, IZTO, IAZO, IGZO, IGTO, AZO, or ATO. For instance, the reflective layer 124 may have the stack structure including IZO/Ni, AZO/Ag, IZO/Ag/Ni, or AZO/Ag/Ni.

In addition, if the second electrode layer 120 includes the bonding layer, the reflective layer 124 may serve as a bonding layer or may include barrier metal or bonding metal. For instance, the bonding layer may include at least one selected from the group consisting of Ti, Au, Sn, Ni, Cr, Ga, In, Bi, Cu, Ag and Ta.

The second electrode 120 may include the conductive support substrate (not shown). The conductive support substrate supports the light emitting structure 110 to provide power to the light emitting structure 110. The conductive support substrate may include metal having superior electric conductivity, a metal alloy or conductive semiconductor material.

For instance, the conductive support substrate may include at least one selected from the group consisting of Cu, a Cu alloy, Au, Ni, Mo, Cu—W, and a carrier wafer, such as Si, Ge, GaAs, GaN, ZnO, SiGe, and SiC.

The conductive support substrate may have a thickness of about 30 μm to 500 μm which may vary depending on the design rule of the light emitting device.

The conductive support substrate can be formed through the electrochemical metal deposition scheme, the plating scheme or the bonding scheme using eutectic metal.

Figure 6:
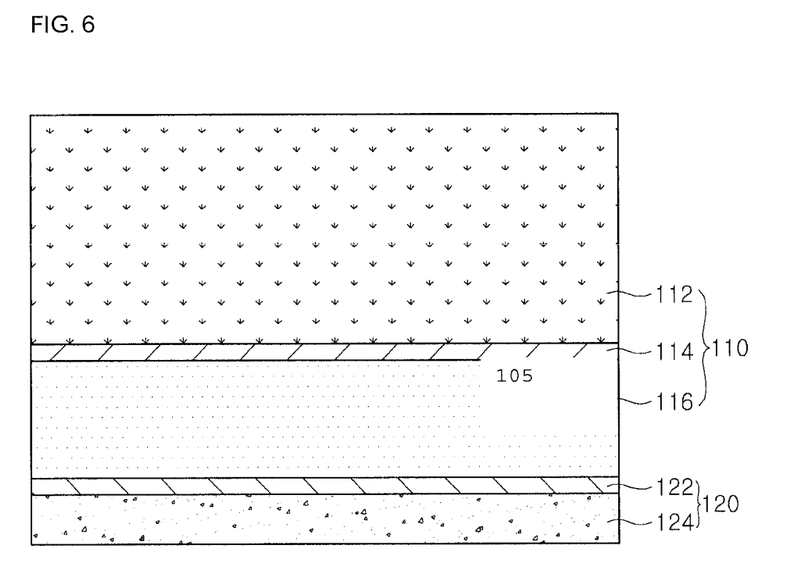

Then, as shown in FIG. 6, the first substrate 105 is removed such that the first conductive semiconductor layer 112 can be exposed. The first substrate 105 can be removed through the laser lift off scheme or the chemical lift off scheme. In addition, the first substrate 105 can be removed by physically grinding the first substrate 105.

Figure 7:
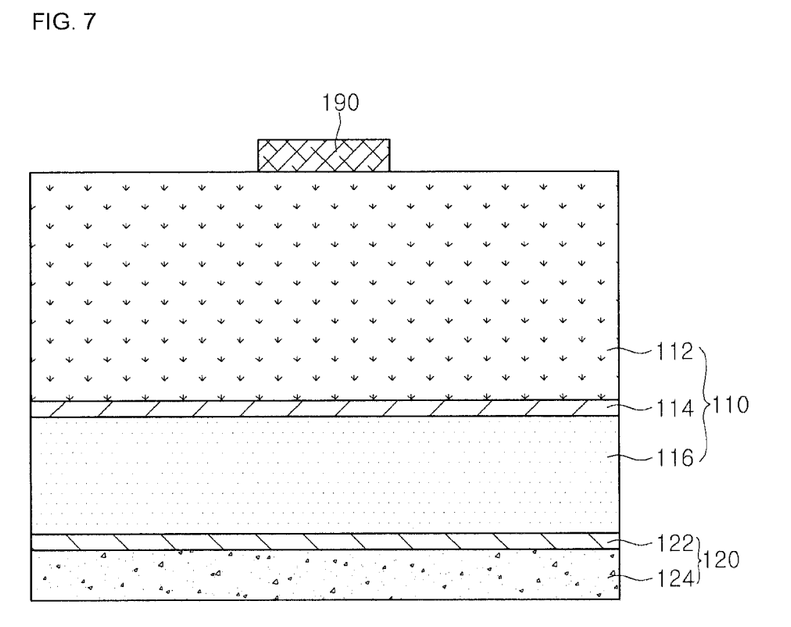
Figure 8A:
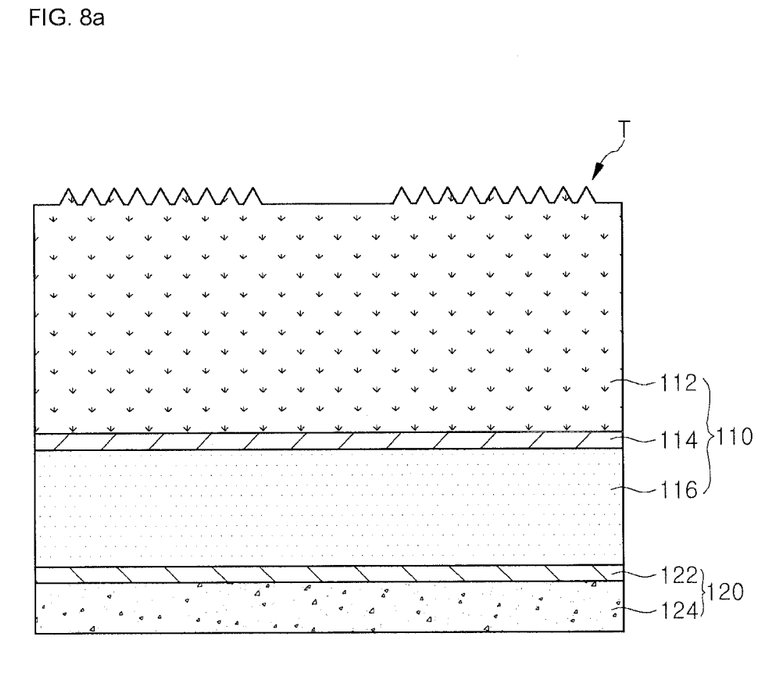

Then, as shown in FIGS. 7 and 8a, the first texture T is formed on the first region of the first conductive semiconductor layer 112.

For instance, as shown in FIG. 7, a mask pattern 190 is formed to block the second region of the first conductive semiconductor layer 112. The pad electrode is formed on the second region later. The mask pattern 190 may include a photoresist pattern or a nitride layer pattern, but the embodiment is not limited thereto.

According to the embodiment, the B-electrode 150b having a predetermined length is formed on the second region of the first conductive semiconductor layer 112 where the first texture T is not formed, so that the quantity of light absorbed in the pad electrode can be reduced, thereby improving the light extraction efficiency. For instance, according to the embodiment, the texture T is not formed on the predetermined region of the first conductive semiconductor layer 112, in which the predetermined region has an area corresponding to an area of the B-electrode 150b serving as the pad electrode connected to the wire, so that the light extraction efficiency can be improved, but the embodiment is not limited thereto.

For example, the area of the second region having no texture is in the range of ±5% based on the area of the B-electrode 150b serving as the pad electrode of the first conductive semiconductor layer 112, but the embodiment is not limited thereto.

Then, the first texture T is formed on the first region of the first conductive semiconductor layer 112 by using the mask pattern 190 as a mask. For instance, the first texture T can be formed on the first region of the first conductive semiconductor layer 112 through the wet etching or dry etching. Then, the mask pattern 190 is removed.

According to the embodiment, the texture may include a periodic pattern, such as a periodic concavo-convex shown in FIG. 8A or a photonic crystal (not shown).

If the holes or the concavo-convexes formed on the surface of the first conductive semiconductor layer 112 have the spatial periodicity, they are called a photonic crystal. The parameters of the photonic crystal, such as a period, an etching depth, a hole size and a lattice arrangement, may closely relate to the light extraction efficiency.

The photonic crystal according to the embodiment may include a mixed-period photonic crystal structure (not shown). The mixed-period photonic crystal structure refers to the structure, in which a second photonic crystal structure having a small period is filled in a space of a first photonic crystal structure having a large period.

According to the embodiment, the mixed-period photonic crystal structure may ensure the high refraction efficiency with respect to various incident angles as compared with the single-period photonic crystal structure. That is, the light extraction efficiency can be improved.

Figure 8B:
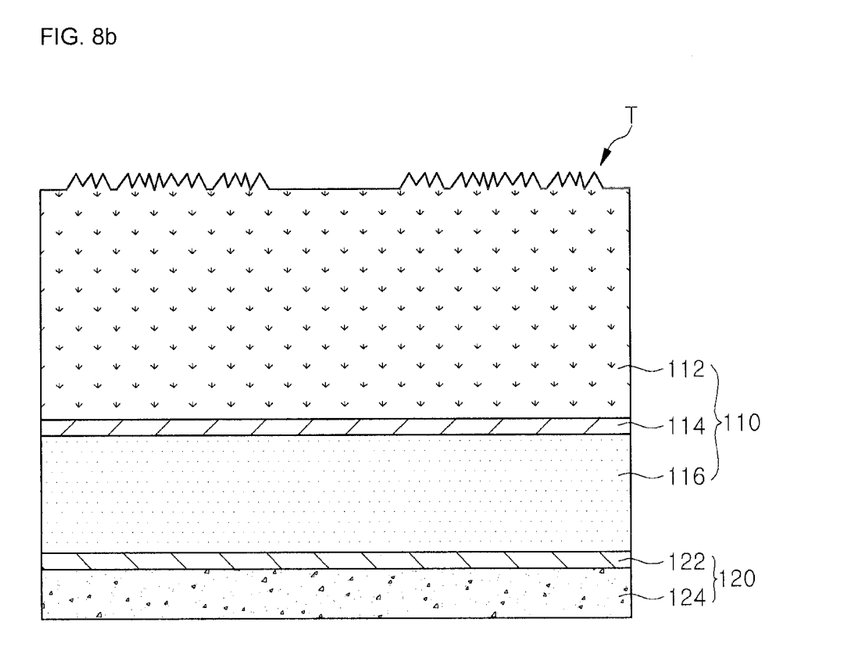

In addition, according to the embodiment, the texture may include a non-periodic roughness as shown in FIG. 8B.

Figure 9:
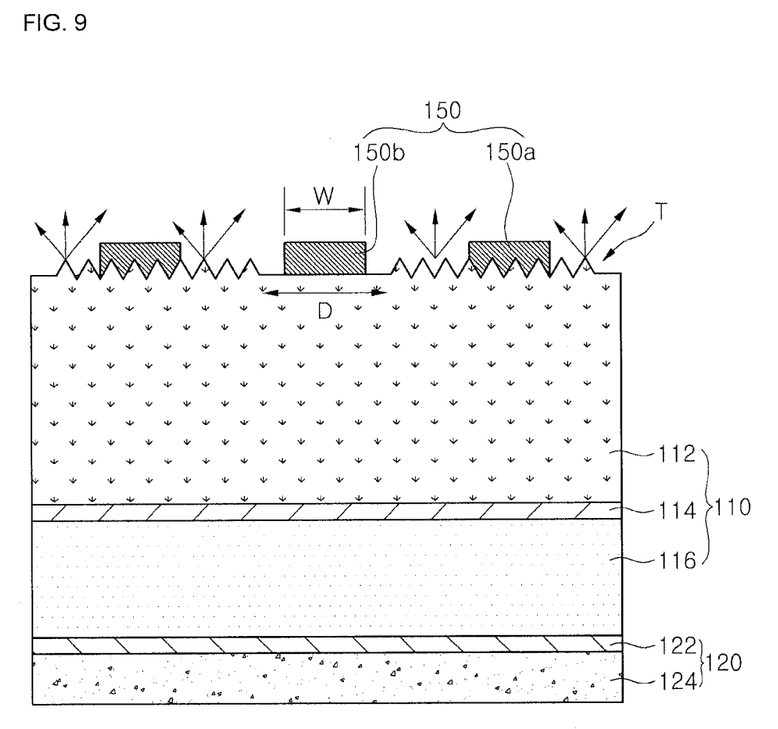

Then, as shown in FIG. 9, the A-electrode 150a is formed on the first region of the first conductive semiconductor layer 112, and the B-electrode 150b is formed on the second region of the first conductive semiconductor layer 112.

For instance, the A-electrode 150a is formed on the first texture T of the first conductive semiconductor layer 112, and the B-electrode 150b is formed on the second region of the first conductive semiconductor layer 112, where the first texture T is not formed.

According to the embodiment, since the texture is not formed under the pad electrode of the light emitting structure, the current crowding can be prevented from occurring under the pad electrode. In addition, since the texture is formed on the remaining region of the light emitting structure, the contact resistance between the light emitting structure and the first electrode becomes low, so that the current spreading effect can be improved.

Meanwhile, although the embodiment discloses the first texture formed under the A-electrode 150a, the embodiment is not limited thereto. That is, according to the embodiment, the texture T can be partially formed under the B-electrode 150b as well as under the A-electrode 150a. For instance, the similar effect can be obtained if the concentration of the second texture under the B-electrode 150b is lower than the concentration of the first texture under the A-electrode 150a.

After that, to realize the white LED, the red, green and blue LEDs are packaged, the yellow phosphor (for example, YAG or TAG) is added to the blue LED or the red/green/blue phosphor is added to the UV LED.

According to the light emitting device and the method of manufacturing the same of the embodiment, the current spreading effect can be improved by adjusting the contact resistance based on the existence of the texture at the contact area between the first conductive semiconductor layer and the first electrode of the light emitting device and the light extraction efficiency can be enhanced by minimizing light absorption in the pad electrode.

For instance, according to the embodiment, since the texture is not formed at the contact area between the first conductive semiconductor layer and the pad electrode of the light emitting device, the light scattering caused by the texture can be reduced, so that the light absorption in the first electrode can be reduced. In addition, since the contact resistance of the contact area is higher than that of other areas, the current crowding can be prevented from occurring under the pad electrode.

In addition, according to the light emitting device of the embodiment, the texture is formed at the contact area between the first conductive semiconductor layer and the A-electrode, other than the B-electrode serving as the pad electrode, so that the contact resistance is reduced, thereby improving the current spreading effect.

Figure 10:
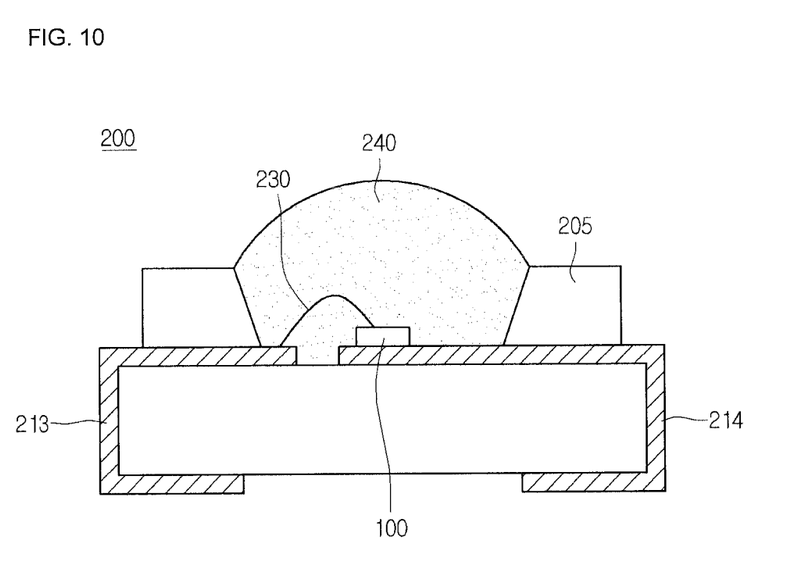
FIG. 10 is a sectional view showing a light emitting device package according to the embodiment.

FIG. 10 is a view showing a light emitting device package 200 including the light emitting device according to the embodiments.

Referring to FIG. 10, the light emitting device package 200 includes a package body 205, third and fourth electrode layers 213 and 214 formed on the package body 205, the light emitting device 100 provided on the package body 205 and electrically connected to the third and fourth electrode layers 213 and 214 and a molding member 240 that surrounds the light emitting device 100.

The package body 205 may include silicon, synthetic resin or metallic material. An inclined surface may be formed around the light emitting device 100.

The third and fourth electrode layers 213 and 214 are electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The vertical type light emitting device shown in FIG. 1 can be employed as the light emitting device 100, but the embodiment is not limited thereto. For instance, the lateral type light emitting device can be used as the light emitting device 100.

The light emitting device 100 can be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire 230 and electrically connected to the fourth electrode layer 214 through the die bonding scheme.

The molding member 240 surrounds the light emitting device 100 to protect the light emitting device 100. In addition, the molding member 240 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 11:
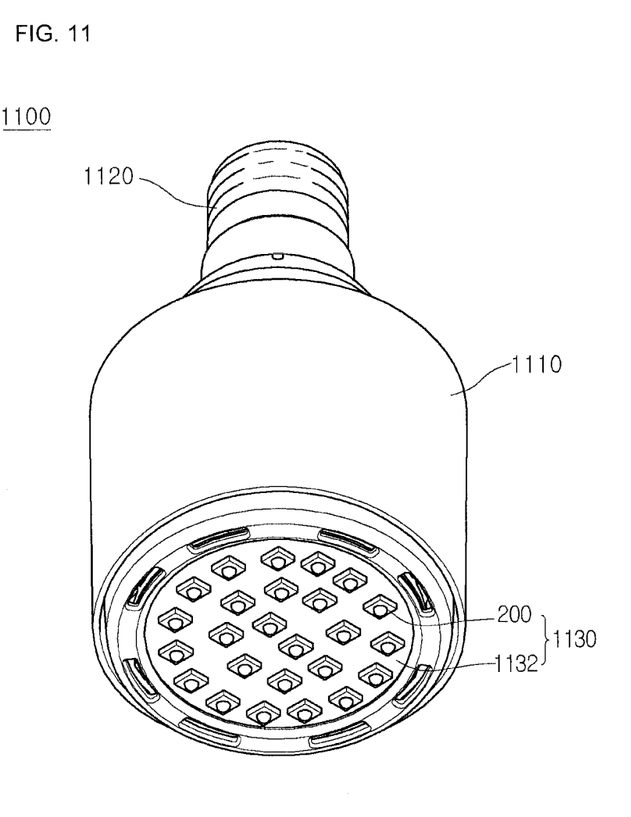
FIG. 11 is a perspective view showing a lighting unit according to the embodiment.

FIG. 11 is a perspective view showing a lighting unit 1100 according to the embodiment. The lighting unit 1100 shown in FIG. 11 is an example of a lighting system and the embodiment is not limited thereto.

Referring to FIG. 11, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes metallic material or resin material.

The light emitting module 1130 may include a substrate 1132 and at least one light emitting device package 200 installed on the substrate 1132.

The substrate 1132 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a predetermined color, such as a white color or a silver color, to effectively reflect the light.

At least one light emitting device package 200 can be mounted on the substrate 1132. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1130 can be variously arranged to provide various colors and brightness. For instance, the white LED, the red LED and the green LED can be arranged in various configurations to achieve the high color rendering index (CRI).

The connection terminal 1120 is electrically connected to the light emitting module 1130 to supply power to the light emitting module 1130. Referring to FIG. 11, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 12:
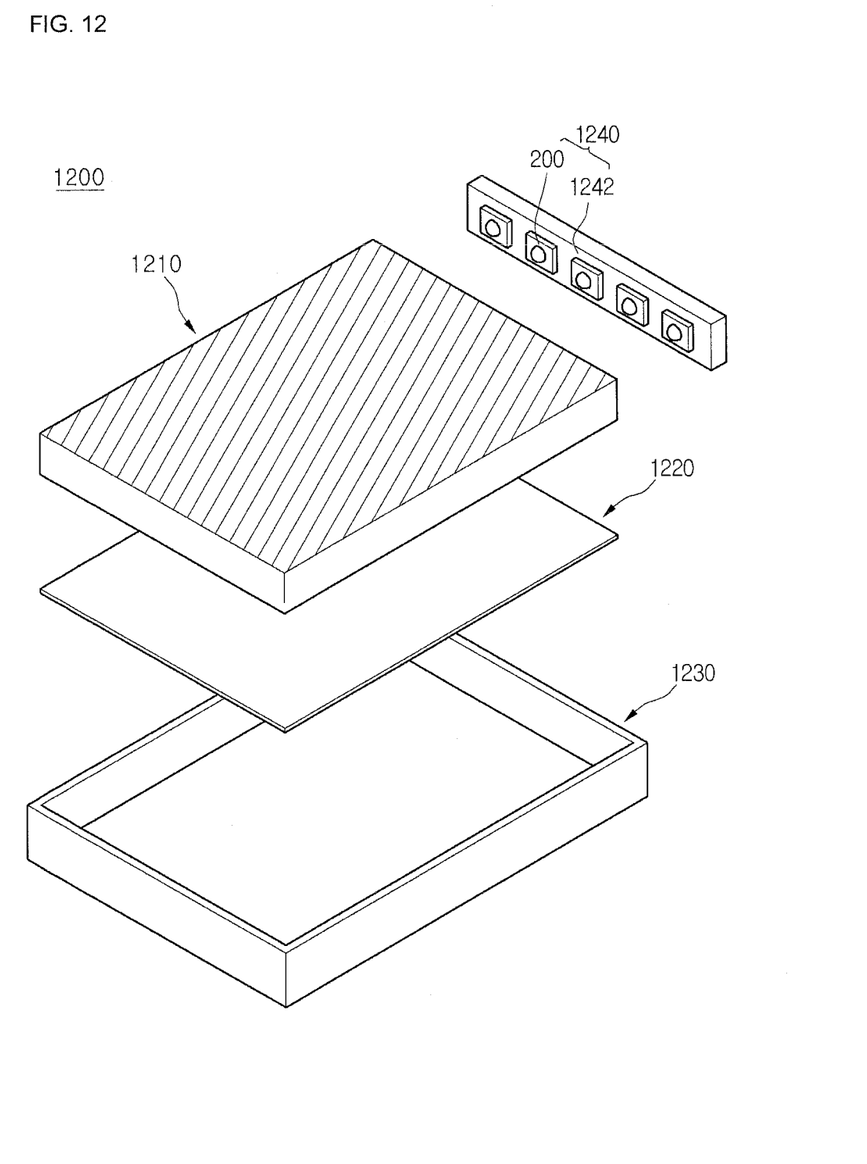
FIG. 12 is an exploded perspective view showing a backlight unit according to the embodiment.

FIG. 12 is an exploded perspective view showing a backlight unit 1200 according to the embodiment. The backlight unit 1200 shown in FIG. 13 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate 2110, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to the lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, the lighting system according to the embodiment includes the light emitting device package, so that the reliability of the lighting system can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
a light emitting structure including a first conductive semiconductor layer, a second conductive semiconductor layer and an active layer between the first and second conductive semiconductor layers;
a second electrode under the second conductive semiconductor layer;
a first texture with a predetermined roughness pattern over a first region of the first conductive semiconductor layer;
an A-electrode over the first region of the first conductive semiconductor layer, wherein the A-electrode is on the first texture; and
a B-electrode over a second region of the first conductive semiconductor layer,
wherein the B-electrode is or includes a pad electrode,
wherein the B-electrode is directly disposed on the second region of the first conductive semiconductor layer,
wherein the A-electrode and the B-electrode are disposed on a same surface of the first conductive semiconductor layer, wherein said same surface of the first conductive semiconductor layer includes an upper surface of the first conductive semiconductor layer, and wherein a bottom surface of the A-electrode is at substantially a same level as a bottom surface of the B-electrode,
wherein a width of the second region having a substantially flat surface is wider than a width of the B-electrode,
wherein the A-electrode surrounds the B-electrode, and
wherein the A-electrode is in contact with both ends of the B-electrode.

2. The light emitting device as claimed in claim 1, wherein the first texture formed on the first region of the first conductive semiconductor layer includes a periodic pattern or a non-periodic roughness.

3. A light emitting device package including the light emitting device of claim 1 and further comprising a package body and third and fourth electrode layers provided on the package body, the light emitting device electrically connected to the third and fourth electrodes.

4. The light emitting device as claimed in claim 1, wherein a contact surface area between the B-electrode and the second region of the first conductive semiconductor layer is smaller than a contact surface area between the A-electrode and the first region of the first conductive semiconductor layer.

5. The light emitting device as claimed in claim 1, wherein the first texture includes a plurality of protruding formations and wherein an area of the second region of the first conductive semiconductor layer on which the B-electrode is directly disposed has substantially no protruding formations.

6. The light emitting device as claimed in claim 1, wherein the A-electrode and the B-electrode are in direct contact with the upper surface of the first conductive semiconductor layer.

7. The light emitting device as claimed in claim 1, wherein a top surface of the A-electrode is at substantially a same level as a top surface of the B-electrode.

8. The light emitting device as claimed in claim 1, wherein both the A-electrode and the B-electrode contact a top surface of the first conductive semiconductor layer.

9. The light emitting device as claimed in claim 1, wherein the first texture is not overlapped with the B-electrode and the first texture is spaced away from the B-electrode.

10. The light emitting device as claimed in claim 1, wherein the A-electrode comprises at least two A-electrodes, and
wherein the B-electrode is disposed at a substantially center portion between the at least two A-electrodes.

11. A light emitting device comprising:
a light emitting structure including a first conductive semiconductor layer, a second conductive semiconductor layer and an active layer between the first and second conductive semiconductor layers;
a first electrode over the first conductive semiconductor layer;
a second electrode over the first conductive semiconductor layer; and
a third electrode under the second conductive semiconductor layer; wherein:
the first conductive semiconductor layer has a surface that includes a first region and a second region,
the surface of the first conducive semiconductor layer in the first region of the first conductive semiconductor layer has a texture with a predetermined roughness pattern,
the surface of the first conductive semiconductor layer in the second region of the first conductive semiconductor layer is substantially flat,
the first electrode is coupled to the texture of the first region of the first conductive semiconductor layer,
the second electrode is in direct contact with the substantially flat surface of the second region of the first conductive semiconductor layer,
the first electrode and the second electrode are disposed on a same surface of the first conductive semiconductor layer, the same surface of the first conductive semiconductor layer including an upper surface of the first conductive semiconductor layer,
wherein a bottom surface of the first electrode is at substantially a same level as a bottom surface of the second electrode,
wherein a width of the second region having the substantially flat surface is wider than a width of the second electrode,
wherein the first electrode surrounds the second electrode, and
wherein the first electrode is in contact with both ends of the second electrode.

12. The light emitting device as claimed in claim 11, wherein the first electrode and the second electrode correspond to different portions of a same electrode layer.

13. The light emitting device as claimed in claim 11, wherein the first electrode is in direct contact with the texture of the first region of the first conductive semiconductor layer.

14. The light emitting device as claimed in claim 13, wherein an area of contact between the first electrode and the first region of the surface of the first conductive semiconductor layer is greater than an area of contact between the second electrode and the second region of the surface of the first conductive semiconductor layer.

15. The light emitting device as claimed in claim 11, wherein the texture with said predetermined roughness pattern is integrally formed on the surface of the first region of the first conductive semiconductor layer.

16. The light emitting device as claimed in claim 11, wherein the second electrode is a pad electrode.

17. The light emitting device as claimed in claim 11, wherein the predetermined roughness pattern includes an irregular pattern of protruding formations.

18. The light emitting device as claimed in claim 11, wherein the predetermined roughness pattern includes a substantially regular pattern of protruding formations.

19. The light emitting device as claimed in claim 11, wherein the first electrode and the second electrode are in direct contact with an uppermost surface of the first conductive semiconductor layer.

20. The light emitting device as claimed in claim 11, wherein the first electrode and the second electrode are disposed in direct contact with the same surface of the first conductive semiconductor layer.

21. The light emitting device as claimed in claim 11, wherein a top surface of the first electrode is at substantially a same level as a top surface of the second electrode.

22. The light emitting device as claimed in claim 11, wherein the texture is not overlapped with the second electrode and the texture is spaced away from the second electrode.

23. The light emitting device as claimed in claim 11, wherein the first electrode comprises at least two first electrodes, and wherein the second electrode is disposed at a substantially center portion between the at least two first electrodes.

* * * * *